United States Patent
Nickel (10) Patent No.: US 12,298,373 B2
(45) Date of Patent: May 13, 2025

(54) PROPELLER MAGNETIC RESONANCE ACQUISITION AND BLADE-SPECIFIC RECONSTRUCTION

(71) Applicant: Siemens Healthcare GmbH, Erlangen (DE)

(72) Inventor: Marcel Dominik Nickel, Herzogenaurach (DE)

(73) Assignee: Siemens Healthineers AG, Erlangen (DE)

( * ) Notice: Subject to any disclaimer, the term of this patent is extended or adjusted under 35 U.S.C. 154(b) by 208 days.

(21) Appl. No.: 18/081,772

(22) Filed: Dec. 15, 2022

(65) Prior Publication Data

US 2023/0184861 A1    Jun. 15, 2023

(30) Foreign Application Priority Data

Dec. 15, 2021 (EP) .................................. 21214703

(51) Int. Cl.
| | | |
|---|---|---|
| *G01V 3/00* | (2006.01) | |
| *G01R 33/56* | (2006.01) | |
| *G01R 33/561* | (2006.01) | |
| *G01R 33/48* | (2006.01) | |

(52) U.S. Cl.
CPC ...... *G01R 33/5611* (2013.01); *G01R 33/5608* (2013.01); *G01R 33/4818* (2013.01)

(58) Field of Classification Search
CPC ............ G01R 33/5611; G01R 33/5608; G01R 33/4818
USPC ....................................................... 324/309
See application file for complete search history.

(56) References Cited

U.S. PATENT DOCUMENTS

| | | | |
|---|---|---|---|
| 6,393,313 B1 * | 5/2002 | Foo ...................... | A61B 5/7257 |
| | | | 324/309 |
| 10,884,086 B1 | 1/2021 | Ersoz et al. | |
| 2004/0258326 A1 * | 12/2004 | Lee ...................... | G01R 33/561 |
| | | | 382/280 |
| 2006/0264735 A1 | 11/2006 | Stemmer | |
| 2008/0068016 A1 | 3/2008 | Gaddipati et al. | |
| 2018/0120401 A1 * | 5/2018 | Shin ................... | G01R 33/4822 |
| 2018/0143277 A1 * | 5/2018 | Chen .................. | G01R 33/5611 |

FOREIGN PATENT DOCUMENTS

| | | | | |
|---|---|---|---|---|
| CN | 101131311 A | * | 2/2008 | |
| CN | 103430038 A | * | 12/2013 | ............. G01R 33/34 |
| DE | 10119660 A1 | * | 10/2002 | ......... G01R 33/5611 |
| DE | 102006024976 B3 | * | 10/2007 | ......... G01R 33/4824 |

(Continued)

OTHER PUBLICATIONS

Hammernik, Kerstin et al.: "Learning a Variational Network for Reconstruction of Accelerated MRI Data"; in: Magnetic Resonance in Medicine; vol. 79; pp. 3055-3071; 2018; DOI 10.1002/mrm.26977.

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

Techniques are provided for determining a magnetic resonance imaging (MRI) image using multiple measurement data sets that form a propeller pattern. Partial MRI images are reconstructed for each measurement data set. The partial MRI images are then combined.

20 Claims, 7 Drawing Sheets

(56) References Cited

FOREIGN PATENT DOCUMENTS

| WO | WO-2017223560 A1 * | 12/2017 | ............... A61B 5/00 |
| WO | WO-2019074958 A1 * | 4/2019 | ............. A61B 34/00 |

OTHER PUBLICATIONS

Ronneberger, Olaf, Philipp Fischer, and Thomas Brox. "U-net: Convolutional Networks for Biomedical Image Segmentation," International Conference on Medical image computing and computer-assisted intervention. Springer, Cham, 2015. pp. 1-8.; 2015.

Lustig M. et al: "Sparse MRI: The Application of Compressed Sensing for Rapid MR Imaging", Magnetic Resonance in Medicine 58: 1182-1195, 2007.

Noll DC et al: "Homodyne detection in magnetic resonance imaging", IEEE Trans Med Imaging. 1991, 10(2), pp. 154-163.

Blaimer, M. et al.: "Artifact Reduction In Undersampled Blade/Propeller Mri By K-Space Extrapolation Using Parallel Imaging," Proc. Intl. Soc. Mag. Reson. Med. 14 (2006), p. 5; 2006.

Deng J. et al.:"Multishot Diffusion-Weighted Propeller Magnetic Resonance Imaging of The Abdomen," Investigative radiology 41.10 (2006): 769-775.

Lustig, Michael et al: "Compressed sensing MRI"; IEEE signal processing magazine; 2008; vol. 25; No. 2; pp. 72-82; DOI: https://doi.org/10.1109/MSP.2007.914728; 2008.

Qiang, He et al: "Regularized Iterative Reconstruction For Undersampled Blade And Its Applications In Three-Point Dixon Water-Fat Separation," Magnetic Resonance In Medicine; vol. 65; No. 5; Feb. 8, 2011; pp. 1314-1325; XP055101885.

Knoll, Florian et al.: "Deep Learning Methods for Parallel Magnetic Resonance Image Reconstruction", in: arXiv:1904.01112v1, pp. 1-14, 2019; 2019.

McGibney, et al: "Quantitative Evaluation of Several Partial Fourier Reconstruction Algorithms Used in MRI," ; Magn. Reson. Med. 30:51-59 (1993).

Pipe, James G. et al: Multishot Diffusion-Weighted FSE using Propeller MRI2; Magnetic Resonance in Medicine 47:42-52 (2002).

Haacke, E. et al: "A Fast, Iterative, Partial-Fourier Technique Capable of Local Phase Recovery," Journal of Magnetic Resonance (1969) 92.1 (1991): 126-145.

Schär, Michael et al.: "Dixon Water-Fat Separation in Propeller MRI Acquired with Two Interleaved Echoes"; Magnetic resonance in medicine; vol. 75; No. 2; Mar. 13, 2015; pp. 718-728; XP055368082.

Malczewski Krzysztof et al.: "Semi-Propeller Compressed Sensing MR Image Super-Resolution Reconstruction"; 2014 International Conference on Signals And Electronic Systems (ICSES); IEEE; Sep. 11, 2014; pp. 1-4; XP032677749.

Skare, Stefan et al.: "Imagedomainpropeller Fast Spin Echo"; Magnetic Resonance Imaging; vol. 31; No. 3; Nov. 30, 2012; pp. 385-395; XP055576256.

Fair Merlin J. et al.: "Propeller Echo-Planar Time-Resolved Imaging with Dynamic Encoding (PEPTIDE)"; Magnetic Resonance in Medicine; vol. 83; No. 6; Nov. 8, 2019; pp. 2124-2137; XP055917584.

Pipe, James G. et al.: "Sampling Density Compensation in MRI: Rationale and an Iterative Numerical Solution"; Magnetic Resonance in Medicine; vol. 41; No. 1; Jan. 29, 1999; pp. 179-186; XP055177222.

\* cited by examiner

PROPELLER MAGNETIC RESONANCE ACQUISITION AND BLADE-SPECIFIC RECONSTRUCTION

CROSS-REFERENCE TO RELATED APPLICATIONS

The present application claims priority to and the benefit of European patent application no. EP 21214703.7, filed on Dec. 15, 2021, the contents of which are incorporated herein by reference in its entirety.

TECHNICAL FIELD

The disclosure generally relates to magnetic resonance imaging (MRI) and, in particular, to determining an MRI image based on multiple MRI measurement datasets that use undersampling trajectories forming a propeller pattern in k-space. The disclosure also relates to machine-learned (ML) algorithms used for MRI reconstruction.

BACKGROUND

The "propeller" technique represents a radial scanning method in magnetic resonance imaging (MRI), and is briefly described in "Magnetic Resonance in Medicine 42:963-969" (1999) by James G Pipe. In the propeller technique, k-space is sampled using multiple MRI measurement datasets. Each MRI measurement dataset can sample a respective fraction of k-space. Typically, an MRI measurement dataset is composed of a number of equidistant, parallel phase-encoding lines, and Cartesian sampling is employed. The k-space trajectories form a propeller pattern in k-space. That is, the k-space trajectories are rotated relative to one another by a certain blade rotation angle. This is the reason why each MRI measurement dataset can be referred to as a "MRI measurement blade".

Conventional techniques of reconstruction of MRI images based on multiple MRI measurement blades is described in U.S. patent application publication no. US2006264735, as well as in Blaimer, M., et al. "Artifact reduction in undersampled BLADE/PROPELLER MRI by k-space extrapolation using parallel imaging," Proceedings of ISMRM (Seattle, Washington, 2006), Program 14 (2006). Such techniques reconstruct the k-space data of each MRI measurement blade, e.g., in case of parallel imaging using GRAPPA, then re-grid the k-space data, and finally perform a Fourier transform the data of the combined k-space to obtain the MRI image.

SUMMARY

A need exists for advanced techniques for determining MRI images based on sets of MRI measurement blades. This need is addressed by the embodiments as discussed herein, including the features described in the claims.

A computer-implemented method of determining an MRI image is provided. The method includes obtaining multiple MRI measurement datasets. Each MRI measurement dataset of the multiple MRI measurement datasets is acquired using a respective undersampling trajectory in k-space. The undersampling trajectories form a propeller pattern in k-space. The method also includes, for each MRI measurement dataset of the multiple MRI measurement datasets, reconstructing a respective partial MRI image using a reconstruction algorithm based on the respective MRI measurement dataset. The method further includes determining the MRI image based on a combination of the partial MRI images.

A device includes a processor and a memory. The processor can load program code from the memory. The processor can execute the loaded program code. Upon executing the program code, the processor is configured to determine an MRI image. This includes obtaining multiple MRI measurement datasets. Each MRI measurement dataset of the multiple MRI measurement datasets is acquired using a respective undersampling trajectory in k-space. The undersampling trajectories form a propeller pattern in k-space. The processor is also configured, for each MRI measurement dataset of the multiple MRI measurement datasets, to reconstruct a respective partial MRI image using a reconstruction algorithm based on the respective MRI measurement dataset. The processor is further configured to determine the MRI image based on a combination of the partial MRI images.

A computer program includes program code for determining an MRI image. The program code causes a processor that executes the program code to obtain multiple MRI measurement datasets. Each MRI measurement dataset of the multiple MRI measurement datasets is acquired using a respective undersampling trajectory in k-space. The undersampling trajectories form a propeller pattern in k-space. The processor also causes, for each MRI measurement dataset of the multiple MRI measurement datasets, to reconstruct a respective partial MRI image using a reconstruction algorithm based on the respective MRI measurement dataset. The processor is further configured to cause a determination of the MRI image based on a combination of the partial MRI images.

It is to be understood that the features mentioned above and those yet to be explained below may be used not only in the respective combinations indicated, but also in other combinations or in isolation without departing from the scope of the disclosure.

BRIEF DESCRIPTION OF THE DRAWINGS

The disclosure is further described by the following figures. The figures exemplarily show how the disclosure can possibly be realized. All mentioned features relating to the figures can be extracted and combined with the embodiments mentioned in this disclosure. The following figures show.

DETAILED DESCRIPTION OF THE DISCLOSURE

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and/or the other electrical devices. Such circuits and/or other electrical devices may be combined with each other and/or separated in any manner based on the particular type of electrical implementation that is desired. It is recognized that any circuit and/or other electrical device disclosed herein may include any suitable number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which cooperate with one another to perform the various function(s) and operation(s) as disclosed herein. In addition, any one or more of the electrical devices may be configured to execute a program code that is stored in or otherwise implemented as a non-transitory computer readable medium to perform any number of the functions as disclosed.

In the following, embodiments of the disclosure will be described in detail with reference to the accompanying drawings. It is to be understood that the following description of embodiments is by way of example and not limitation. The scope of the disclosure is not intended to be limited by the embodiments described herein or by the drawings, which are provided by way of example and not limitation.

The drawings are to be regarded as being schematic representations, and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various techniques described herein generally relate to MRI imaging. MRI data (or raw data) is acquired in k-space by sampling k-space. Parallel imaging can be applied. Here, MRI data is acquired using an array of receiver coils having a predefined spatial sensitivity. The set of MRI data (MRI measurement dataset) is sparsely sampled in k-space, i.e., MRI data is acquired below the Nyquist threshold for a given field of view. This is sometimes referred to as undersampling k-space. According to various embodiments, the MRI measurement datasets may be obtained using an undersampling trajectory. When acquiring MRI measurement datasets using an undersampling trajectory for certain k-space locations, raw MRI data is not sampled, and the missing information is reconstructed later. A so-called acceleration factor is indicative of the fraction of those k-space locations along the undersampling trajectory for which no raw data samples are acquired. Larger (smaller) acceleration factors may result in a shorter (longer) scan times.

Various techniques are concerned with determining MRI images. The MRI images can be determined based on multiple MRI measurement datasets acquired using respective undersampling trajectories, wherein these undersampling trajectories form a propeller pattern and k-space. Accordingly, hereinafter, each MRI measurement dataset will be referred to as an MRI measurement blade.

Each MRI measurement blade may utilize a k-space trajectory implementing Cartesian sampling of the k-space. Also, other sampling patterns are possible.

Then, MRI reconstruction is employed to reconstruct MRI images; MRI images can be reconstructed so that they have no or only few/reduced aliasing artifacts. The MRI reconstruction combines MRI data from multiple receive coils, and often relies on predetermined or calibrated coil sensitivity maps (CSMs) of multiple receiver coils of the RF receiver of the MRI device used. According to various embodiments, it would also be possible that the reconstruction algorithm relies on different CSMs of the multiple receiver coils for the reconstruction of each MRI measurement blade. This means that different CSMs may be relied upon for the reconstruction of each MRI measurement blade. For example, the CSMs could be estimated based on a target resolution of the final MRI image, and then interpolated for each partial MRI image, i.e., for each MRI measurement blade. Coverage and resolution can be adapted accordingly. The CSMs used for reconstruction of a given partial MRI image may be derived from a joint/root CSM and interpolated to the sampling pattern (i.e., in accordance with the respective k-space trajectory) of each MRI measurement blade.

According to various embodiments, each MRI measurement blade is individually reconstructed to thereby obtain respective partial MRI images. These partial MRI images have a low resolution due to a comparably low resolution in phase-encoding direction of the MRI measurement blades. Once the partial MRI images have been determined, the (final) MRI image can be determined based on a combination of the partial MRI images.

Intermediate steps for phase correction, e.g. a partial Fourier reconstruction, motion compensation, and/or advanced techniques of the combination are possible.

To reconstruct the partial MRI images, various MRI reconstruction algorithms can be implemented. For example, compressed sensing could be implemented. See, e.g., Lustig, Michael, David Donoho, and John M. Pauly. "Sparse MRI: The application of compressed sensing for rapid MR imaging," Magnetic Resonance in Medicine: An Official Journal of the International Society for Magnetic Resonance in Medicine 58.6 (2007): 1182-1195; also see Lustig, Michael, et al. "Compressed sensing MRI," IEEE signal processing magazine 25.2 (2008): 72-82. Such prior art techniques typically rely on the representation of MRI images in a wavelet basis. As described in id., page 13, section "Image Reconstruction", an optimization problem (typically involving an l1-norm) can be defined.

Data consistency can be enforced by a data-consistency operation ensuring that the reconstructed image is described well by the underlying sparsely sampled k-space data. The data-consistency operation is also sometimes referred to as a data-fidelity operation, and includes a forward-sampling operator. In addition to the data-consistency operation, oftentimes a regularization operation is considered. The regularization operation is conventionally based on a nonlinear l1-norm. A classic formulation of the regularization operation is based on sparsity of the MRI image in a transform domain, such as a wavelet domain in combination with pseudo-random sampling that can introduce aliasing artifacts that are incoherent in the respective transform domain. Another example would be a Fourier domain, in particular for acquisitions of a dynamically moving target. Another example would be total variation (TV) used in connection with non-Cartesian k-space trajectories such as radial and spiral trajectories. Based on the data-consistency operation and the regularization operation, an iterative optimization can be implemented. The iterative optimization can include multiple iterations, each iteration including the calculation of the data-consistency operation and the regularization operation in an alternating fashion, using a compressed sensing scheme.

Recently, the regularization operation has been implemented by means of deep neural networks. Here, different iterations of the optimization are implemented by different layers of the deep neural network. See Hammernik, Kerstin, et al. "Learning a variational network for reconstruction of accelerated MRI data," Magnetic resonance in medicine 79.6 (2018): 3055-3071, as well as Knoll, Florian, et al. "Deep learning methods for parallel magnetic resonance image reconstruction," arXiv preprint arXiv:1904.01112 (2019). Such techniques are based on the finding that wavelet compositions can be expressed as a subset of trainable convolutions of a deep neural network such as a convolutional neural network, and that soft-thresholding can be used as an activation function in the deep neural network.

A deep neural network that can be used for implementing the regularization operation is the U-net, see Ronneberger, Olaf, Philipp Fischer, and Thomas Brox. "U-net: Convolutional networks for biomedical image segmentation," International Conference on Medical image computing and computer-assisted intervention. Springer, Cham, 2015. The U-net employs skip-connections between hidden layers and down-sampling and up-sampling of feature maps. For example, an iterative optimization can include (i) a regularization operator, which is implemented by a trained neural network such as a Convolutional Neural Network (CNN) for filtering of the input MRI dataset using convolutions and non-linear activations; and (ii) a data-consistency operator (sometimes referred to as forward-sampling operator or data fidelity operator) for computation of an MRI forward model to assure agreement of the reconstructed MRI dataset with the MRI measurement data. This approach of using an iterative optimization together with a deep-neural network having layers associated with each iteration goes by the name of a variational neural network (VNN). The complete network is also called an unrolled image reconstruction network, or simply an unrolled network.

Multiple iterations of (i) and (ii) iteratively refine the reconstructed MRI measurement dataset, wherein an appropriate optimization technique, for example a gradient descent optimization technique or Landweber iterations, a prima-dual method, or alternating direction method of multipliers as known in the art, may be used to optimize parameters from iteration to iteration, i.e., to minimize a goal function including the regularization operator and the data-consistency operator. Such optimization techniques may define parts of the data-consistency operation. The data-consistency operation can be based on the squared-norm of the difference between measured data and synthesized data using a signal model. A gradient can be considered in accordance with the optimization technique. In particular, for decorrelated data with Gaussian noise, this can be a good choice. The signal model can be SENSE-type and may rely for instance on predefined CSMs. The CSMs can be calculated separately and optionally refined/estimated during the reconstruction, e.g., separately for each MRI measurement blade.

By using the ML algorithm in the context of the iterative optimization and, more specifically, the regularization operation, an increased image quality may be provided. A reduced noise amplification and reduced image artifacts can be obtained, in comparison with the conventional reconstruction techniques. The natural image appearance may be better preserved using an ML algorithm, e.g. without causing significant blurring in comparison to techniques with hand-crafted regularization operators. Conventional compressed sensing techniques may be slow, and may result in less natural-looking images. Using the ML algorithm, faster image reconstruction may be achieved using a predefined number of iterations of the ML algorithm. The reconstruction time is usually several orders of magnitude faster than in other iterative methods. A further advantage of such deep-learning MRI reconstruction is that patient-specific tuning of the regularization operation of the iterative optimization is not required.

One or more parameters of the variational neural network algorithm may be determined using a training based on a ground-truth MRI dataset, which may comprise reference MRI images with reduced MRI artifacts and/or noise amplification. The ground-truth MRI dataset can be used to generate synthetic undersampled MRI data, and then MRI reconstruction can be used to reconstruct a synthetically undersampled MRI image. An offline end-to-end training is also possible to obtain better results.

According to various examples, such an ML reconstruction algorithm need not be trained specifically based on MRI measurement blades; conventional MRI measurement data sets, i.e., those not forming a propeller pattern, may be used. Consequently, the reconstruction is particularly flexible with regard to the protocol settings, because typically training data is available for a wide variety of protocol settings of Cartesian sampling of the k-space.

Figure 1:
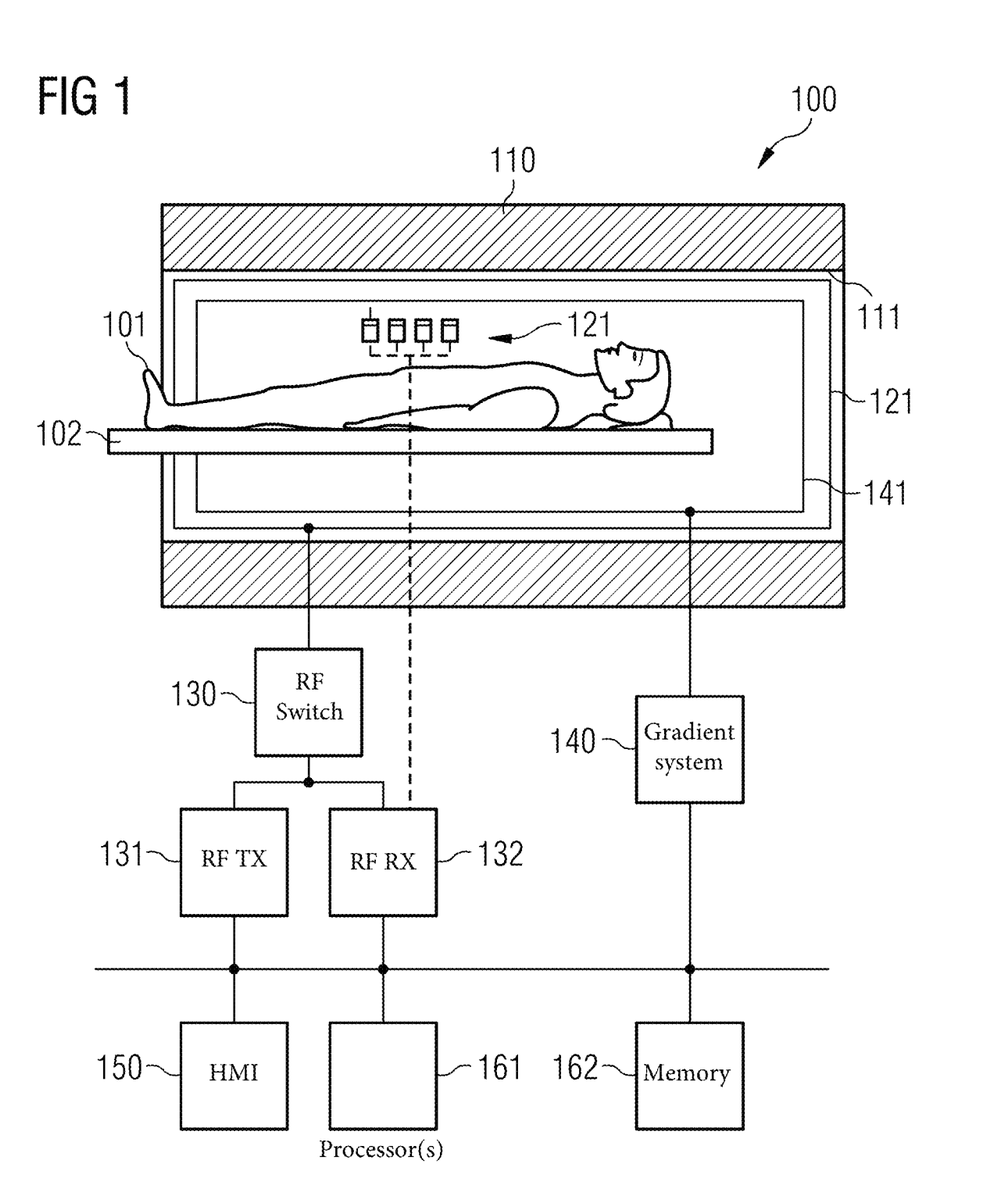
FIG. 1 illustrates an example MRI device according to various embodiments of the present disclosure.

FIG. 1 depicts aspects with respect to an MRI device 100. The MRI device 100 includes a magnet 110, which defines a bore 111. The magnet 110 may provide a DC magnetic field of one to six Tesla along its longitudinal axis. The DC magnetic field may align the magnetization of the patient 101 along the longitudinal axis. The patient 101 may be moved into the bore by means of a movable table 102.

The MRI device 100 also includes a gradient system 140 for creating spatially-varying magnetic gradient fields (gradients) used for spatially encoding MRI data. Typically, the gradient system 140 includes at least three gradient coils 141 that are arranged orthogonal to each other and may be controlled individually. By applying gradient pulses to the gradient coils 141, it is possible to apply gradients along certain directions. The gradients may be used for slice selection (slice-selection gradients), frequency encoding (readout gradients), and phase encoding along one or more phase-encoding directions (phase-encoding gradients). The directions along which the various gradients are applied are not necessarily in parallel with the axes defined by the coils 141. Rather, it is possible that these directions are defined by a certain k-space trajectory, for example of a respective MRI measurement blade, which, in turn, may be defined by certain requirements of the respective MRI sequence and/or based on anatomical properties of the patient 101.

For preparation and/or excitation of the magnetization polarized/aligned with the DC magnetic field, RF pulses may be applied. For this, an RF coil assembly 121 is provided which is configured to apply an RF pulse such as an inversion pulse or an excitation pulse or a refocusing pulse. While the inversion pulse generally inverts the direction of the longitudinal magnetization, excitation pulses may create transversal magnetization.

For creating such RF pulses, a RF transmitter 131 is connected via a RF switch 130 with the coil assembly 121. Via a RF receiver 132, it is possible to detect signals of the magnetization relaxing back into the relaxation position aligned with the DC magnetic field. For instance, it is possible to detect echoes. Echoes may be formed by applying one or more RF pulses (spin echo) and/or by applying one or more gradients (gradient echo). The magnetization may be inductively coupled with the coil assembly 121 for this purpose. Thereby, raw MRI data in k-space is acquired.

Generally, it would be possible to use separate coil assemblies for applying RF pulses on the one hand side and for acquiring MRI data on the other hand side (not shown in FIG. 1). For example, for applying RF pulses, a comparably large body coil may be used, while for acquiring MRI data, a surface coil assembly including an array of comparably small coils could be used. For example, the surface coil assembly could include 32 individual RF coils arranged as receiver coil array 139, and thereby facilitate spatially-offset coil sensitivities. Respective CSMs are defined.

The MRI device 100 further includes a human machine interface (HMI) 150, e.g., a screen, a keyboard, a mouse, etc. By means of the human machine interface 150, a user input may be detected and output to the user may be implemented. For example, by means of the human machine interface 150, it is possible to set certain configuration parameters for the MRI sequences to be applied.

The MRI device 100 further includes a processing unit (also referred to herein as processing circuitry or simply one or more processor) 161. The processor 161 may include a GPU and/or a CPU. The processor(s) 161 may implement various control functionality with respect to the operation of the MRI device 100, e.g., based on program code loaded from a memory 162. For example, the processor(s) 161 may implement a sequence control for time-synchronized operation of the gradient system 140, the RF transmitter 131, and the RF receiver 132. The processor(s) 161 may also be configured to implement an MRI reconstruction, i.e., implement post-processing for MRI reconstruction of MRI images based on MRI measurement datasets.

It is not required in all scenarios that processor(s) 161 implement post-processing for reconstruction of the MRI images. In other examples, it would be possible that respective functionalities implemented by a separate device.

Figure 2:
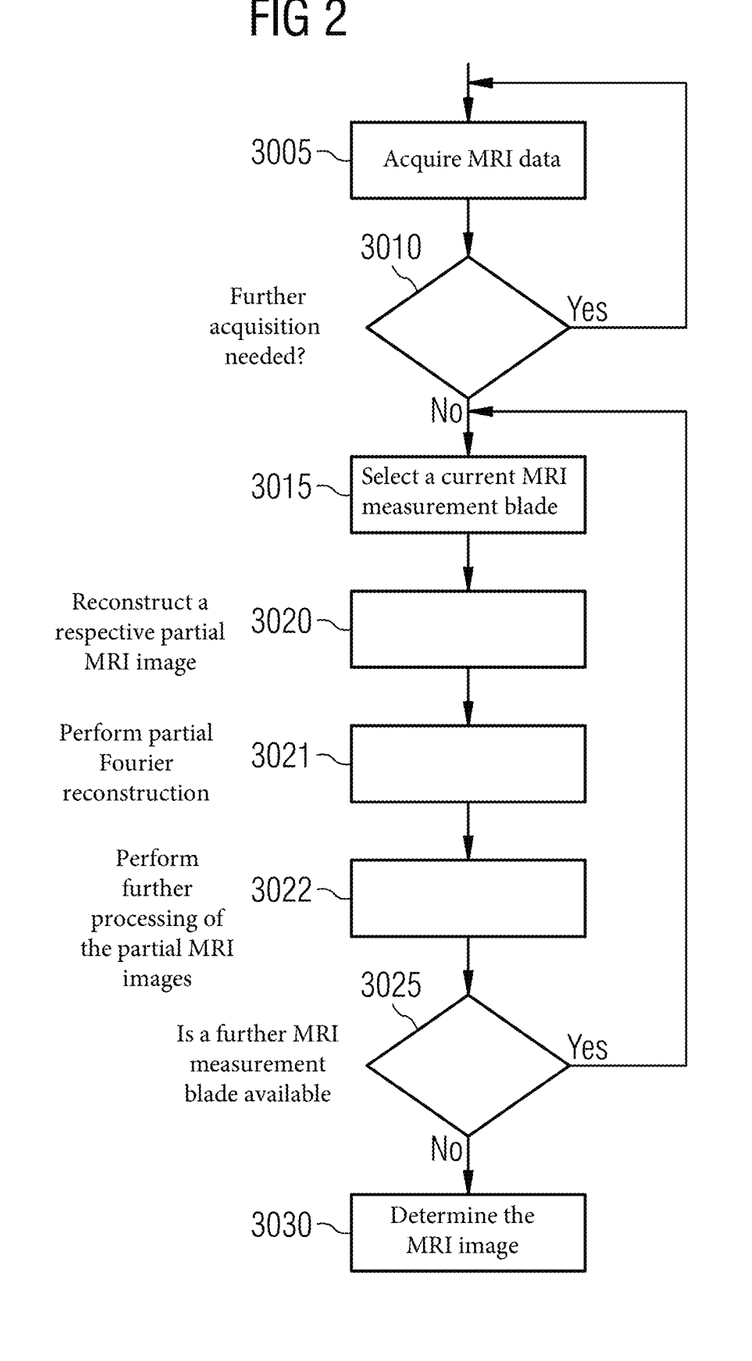
FIG. 2 illustrates an example flowchart of a method according to various embodiments of the present disclosure.

FIG. 2 is a flowchart of a method according to various examples. FIG. 2 schematically illustrates postprocessing for reconstruction of MRI images. For instance, the method of FIG. 2 could be implemented by the processor(s) 161. It would also be possible that the method of FIG. 2 is implemented by a standalone device that is separate from the MRI device 100, e.g., by a personal computer, desktop computer, etc., including a processor that can load and execute program code from a memory. Cloud processing is also possible.

Initially, at box 3005 and at box 3010, acquisition of MRI data optionally takes place (in other scenarios, the MRI data may already be pre-acquired).

Specifically, at box 3005, MRI data of a respective MRI measurement blade is acquired, by sampling the k-space along a respective undersampling trajectory.

Figure 3:
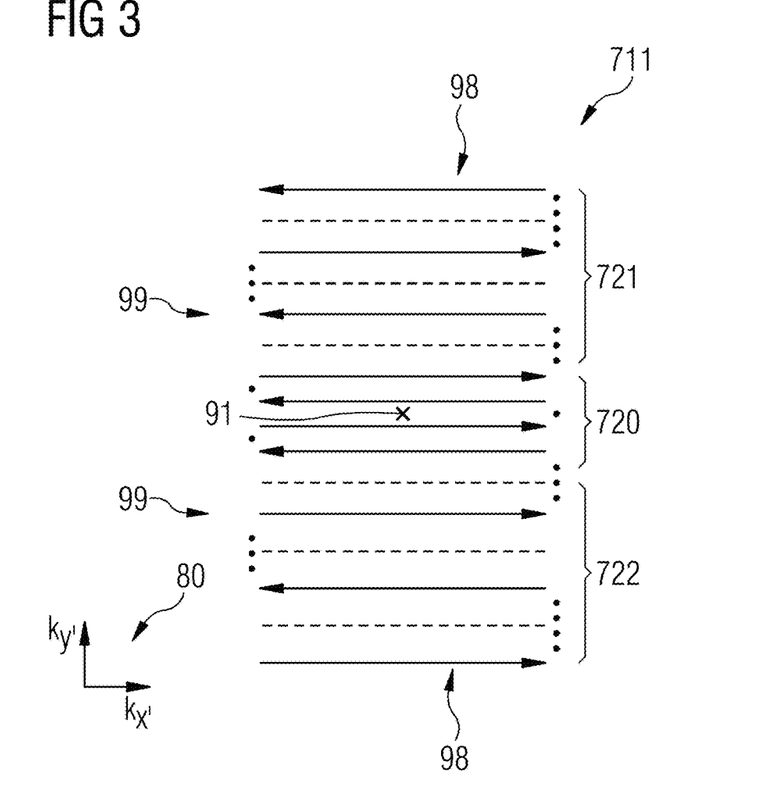
FIG. 3 illustrates an example MRI measurement blade according to various embodiments of the present disclosure.

An example k-space trajectory 98 is illustrated in FIG. 3 for an example MRI measurement blade 711. Here, k-space lines 99 along phase-encoding direction are acquired and k-space is undersampled, as illustrated by the dashed horizontal lines.

In further detail, a region 720 around a center 91 of k-space is densely sampled, e.g., to obtain calibration data for the reconstruction algorithm. Outer regions 721 and 722 are undersampled. A respective blade-specific coordinate system 80 of k-space (also referred to as the Fourier domain) with k-space directions kx' and ky' is also illustrated.

As a general rule, for each MRI measurement blade, the raw data is acquired with a respective echo train, also referred to as "shot." Each MRI measurement blade is typically a single-shot measurement, i.e. using a single excitation of the magnetization. For instance, a single-shot or multi-shot fast spin-echo sequence or turbo-spin echo (e.g. HASTE) acquisition can be used. See Pipe, James G., Victoria G. Farthing, and Kirsten P. Forbes, "Multishot diffusion-weighted FSE using PROPELLER MRI," Magnetic Resonance in Medicine: An Official Journal of the International Society for Magnetic Resonance in Medicine 47.1 (2002): 42-52; also see Deng, Jie, et al. "Multishot diffusion-weighted PROPELLER magnetic resonance imaging of the abdomen," Investigative radiology 41.10 (2006): 769-775.

Figure 4:
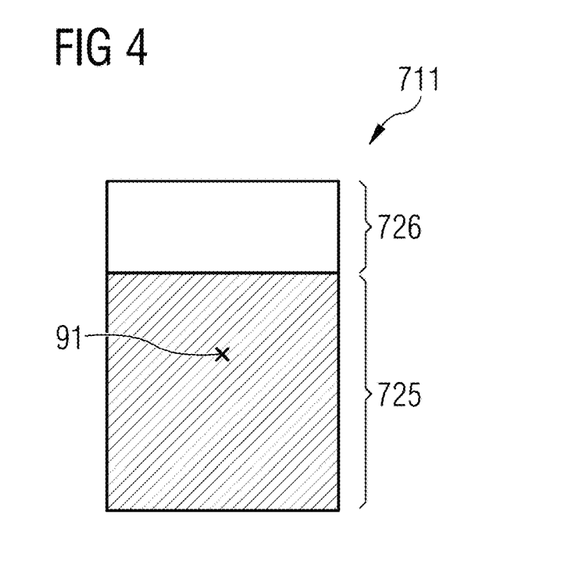
FIG. 4 illustrates an example asymmetric partial sampling of k-space for an MRI measurement blade according to various embodiments of the present disclosure.

FIG. 3 schematically illustrates a symmetric sampling of the k-space, i.e., the sampling points for which raw data is acquired above and below the k-space center 91 are symmetrically arranged. In a possible variation, for each one of the undersampling trajectories of the MRI measurement blades, sampled k-space may use an asymmetric partial sampling with respect to the k-space center 91. This is illustrated in FIG. 4. Here, a region 725 of the k-space is undersampled (for ease of explanation, in FIG. 4 the k-space lines 99 are not shown); and the region 726 is not sampled, but later reconstructed. Such partial sampling and subsequent reconstruction is referred to as a partial Fourier technique. See Noll, Douglas C., Dwight G. Nishimura, and Albert Macovski, "Homodyne detection in magnetic resonance imaging," IEEE transactions on medical imaging 10.2 (1991): 154-163; further see Haacke, E. Mark, E. D. Lindskogj, and Weili Lin, "A fast, iterative, partial-Fourier technique capable of local phase recovery," Journal of Magnetic Resonance (1969) 92.1 (1991): 126-145; and further see McGibney, G., et al. "Quantitative evaluation of several partial Fourier reconstruction algorithms used in MRI," Magnetic resonance in medicine 30.1 (1993): 51-59. The partial Fourier technique enables a further reduction in the measurement duration.

Now again referring to FIG. 2: At box 3010, it is checked whether acquisition of MRI data for a further MRI measurement blade is required; in the affirmative, box 3005 is re-executed for the further MRI measurement blade. The k-space trajectory of the further MRI measurement blade of the subsequent iteration of box 3005 is rotated by the blade rotation angle with respect to the k-space trajectory of a preceding iteration of box 3005.

Figure 5:
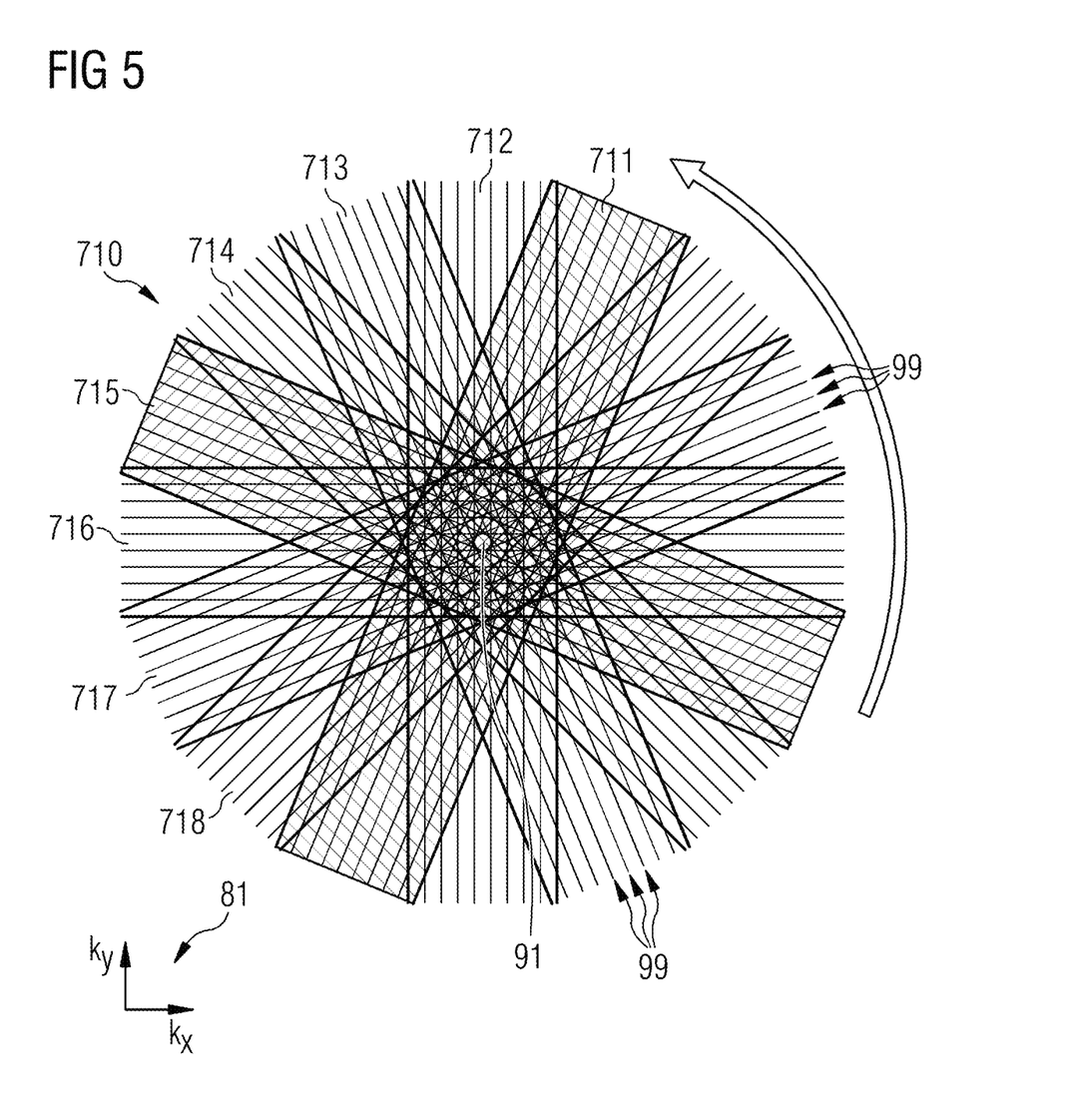
FIG. 5 illustrates an example of multiple MRI measurement blades arranged in a propeller pattern according to various embodiments of the present disclosure.

For instance, FIG. 5 schematically illustrates MRI measurement blades 711-718 forming a propeller pattern 710. Each MRI measurement blade 711-718 can be configured according to the explanations made with respect to the measurement blade 711 in FIG. 3. Each MRI measurement blade 711-718 includes, in the illustrated example, 10 phase encoding k-space lines.

As a general rule, each MRI measurement blade 711-718 may include any suitable number (e.g. at least 10, at least 20, at least 30, etc.) phase encoding k-space lines. For a single shot (i.e. corresponding to the acquisition of a single blade) the phase encoding steps can be acquired in a linear order. The image contrast is determined by the duration from the excitation pulse to the acquisition to the k-space center line, also referred to as echo time. T2-weighted image contrasts correspond to echo times of about 80-120 ms. The sampling duration, also referred to as echo spacing, is on the order of 5-10 ms. In the case of an asymmetric acquisition, the truncation is typically done for the earlier part of the acquisition, therefore increasing the number of phase encoding lines when keeping echo time and echo spacing fixed.

FIG. 5 also illustrates a common k-space coordinate system 81; for instance, a re-gridding operation used to combine multiple partial MRI images can operate based on this common k-space coordinate system 81.

Turning back to FIG. 2, it is noted that it is optional to implement the data acquisition at boxes 3005 and 3010; in other examples, it would be possible that the MRI measurement blades are pre-acquired.

Once the MRI data has been acquired or otherwise obtained (e.g. loaded from a memory), the method commences with the determination of an MRI image. This post-processing includes boxes 3015, 3020, 3025, and 3030.

At box 3015, a current MRI measurement blade from the set of all available MRI measurement blades is selected.

Next, at box 3020, a respective partial MRI image is reconstructed using a reconstruction algorithm, based on the currently selected MRI measurement blade of the current iteration of box 3015. Each partial MRI image could be reconstructed as a coil-combined image, e.g. considering raw data of multiple coils and respective CSMs. This is different than, e.g., a pure GRAPPA based reconstruction in k-space of individual coil data.

For instance, a SENSE reconstruction technique, i.e. the reconstruction algorithm, can be based on an iterative optimization using a compressed sensing scheme, or a ML reconstruction technique may be employed; here, an optimization can be employed in the target function of the optimization can take into account a regularization operation, wherein the regularization operation is implemented using a variational neural network algorithm.

In case k-space is asymmetrically partially sampled using respective undersampling trajectories of a partial Fourier technique (cf. FIG. 4), at box 3021 a partial Fourier reconstruction can be implemented. This can include, for each partial MRI image, filling k-space positions for which k-space data is missing due to the asymmetric partial sampling by copying k-space data from a conjugate symmetric location in k-space.

Next, at optional box 3022, further processing of the partial MRI images would be possible. For instance, it would be possible that the multiple partial MRI images are input into a ML algorithm, e.g., a neural network algorithm. Filtering becomes possible. The neural network algorithm can be trained to modify the partial MRI images, e.g., to thereby reduce streaking artifacts in the MRI image that is subsequently determined and/or to compensate local misalignments of the multiple partial MRI images. Local misalignments originate from the temporal gap between the acquisition of the individual blades. A fraction of the blades can be acquired in locally-varying positions of the underlying object. Also, the image contrast may be affected by motion and other physiological sources such as (e.g. blood) flow. In one example, a neural network may be trained to combine the individual blade images with the task of suppressing misaligned images, or images with a varying image contrast. For this purpose, the individual blade images may be interpolated to the final image orientation and resolution and jointly inserted into a neural network as a stack of images. The networks may also be trained to perform an implicit non-rigid registration of the concatenated images. As a related task, the network may be trained to suppress artifacts from insufficient angular coverage of the blades. The latter amounts to wedge-shaped holes in the acquired k-space, and are known to produce streak-shaped image artifacts. The network is then performing a processing related to multiple-image super-resolution.

Streaking artifacts can generally result from a re-gridding operation that is later applied to combine the partial MRI images. Streaking artifacts can be described as diffuse "halo" surrounding fine structures or streaks.

At box 3025, it is checked whether a further MRI measurement blade is available; in the affirmative, a further iteration of box 3015 in box 3020 is executed; otherwise, the method proceeds to box 3030.

Figure 6:
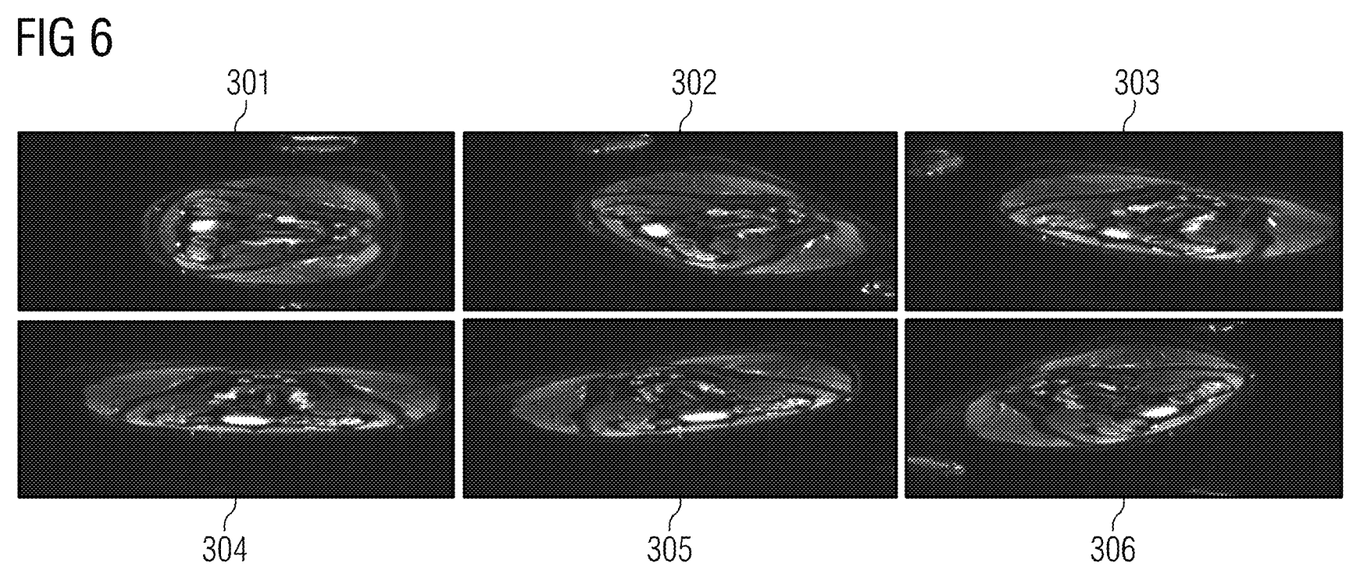
FIG. 6 illustrates an example of multiple partial MRI images obtained by individually reconstructing MRI measurement blades according to various embodiments of the present disclosure.

As a result, a set of multiple partial MRI images 301-306 is obtained (cf. FIG. 6; where the partial MRI images 301-306 are illustrated in image domain; shown are the individually reconstructed magnitude partial MRI images in the logical coordinates of each blade, i.e., left-right is readout direction, up-down is PE direction; the MRI measurement blades have high resolution in readout direction and low resolution in phase encoding direction). These multiple partial MRI images 301-306 are rotated with respect to each other, in accordance with the propeller pattern formed by the MRI measurement blades. Further, the multiple partial MRI images 301-306 are skewed and/or stretched with respect to each other.

Referring again to FIG. 2, at box 3030, the MRI image is determined (e.g. generated or otherwise computed) based on a combination of the partial MRI images having been determined in the multiple iterations of box 3020 for each MRI measurement blade.

As a general rule, various options are available for implementing the combination at box 3030. For instance, the combination could be performed in k-space. This means that it would be possible to apply a Fourier transform of the partial MRI images 301-306 into the Fourier domain, from the image domain (cf. FIG. 6).

For instance, the combination could be performed in the Fourier domain of the partial MRI images under consideration of the sampling density of the k-space defined by the propeller pattern and the relative orientation of the partial MRI images.

Figure 7:
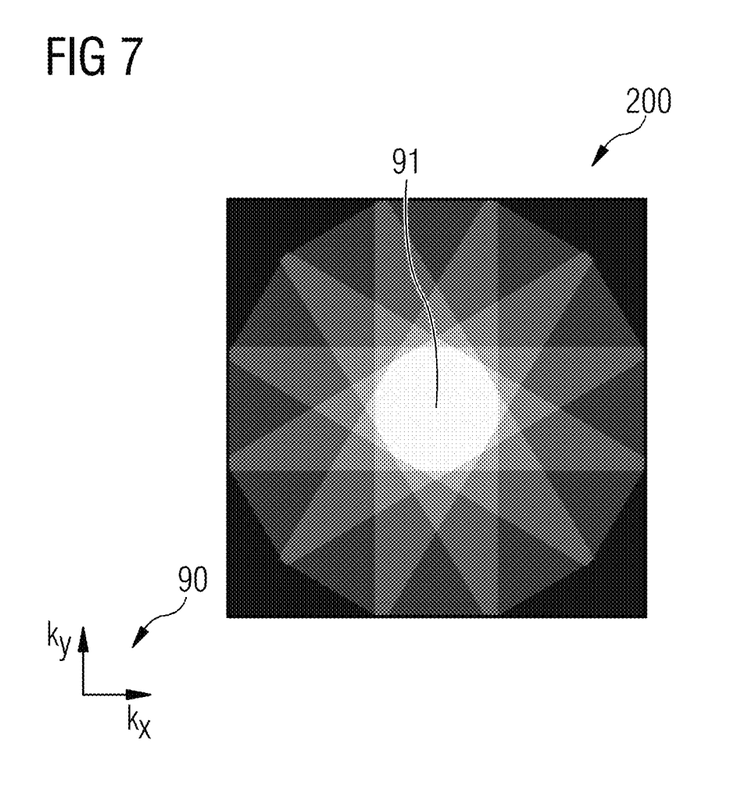
FIG. 7 illustrates an example k-space sampling density of the MRI measurement blades arranged in a propeller pattern according to various embodiments of the present disclosure.

The sampling density 200 is illustrated in FIG. 7. Here, the region around the k-space center 91 is sampled at a higher density (i.e., data samples per unit area in k-space) if compared to the outer regions, because the k-space trajectories of the various MRI measurement blades overlap around the k-space center 91.

For instance, it would be possible that the k-space representations of the partial MRI images are re-gridded to a predefined target k-space sampling pattern to thereby obtain a joint k-space representation of the MRI image. This means that using e.g. interpolation, it is possible to calculate data samples that fulfill a certain predefined arrangement in k-space. The interpolation can be between data samples of each MRI measurement blade, or across data samples of different MRI measurement blades.

The joint k-space representation of the MRI images could be normalized in accordance with the sampling density 200. For instance, where a higher sampling density is present (typically around the k-space center 91), each individual data sample may be reduced in amplitude by an appropriate factor compensating for the higher sampling density.

Figure 8:
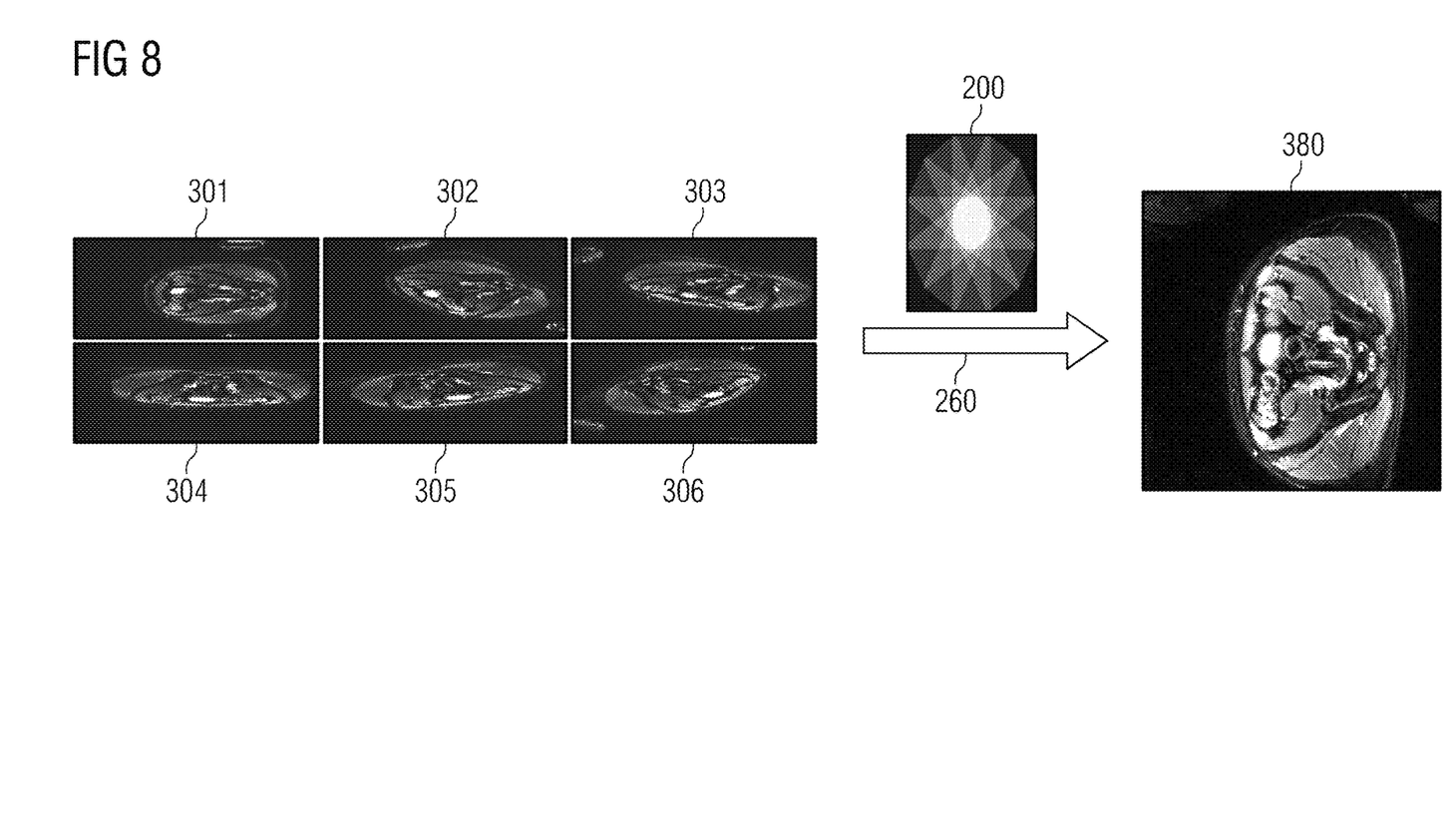
FIG. 8 illustrates an example of data processing to determine an MRI image according to various embodiments of the present disclosure.

An example workflow is illustrated in FIG. 8. Here, the combination 260 is executed in the Fourier domain based on the partial MRI images 301-306 and under consideration of the sampling density 200, to thereby obtain the MRI image 380.

It is not required in all scenarios that the combination is implemented in k-space of the partial MRI images 301-306. According to various examples, the combination could also be executed in the image domain using rotation and skewing operations that are defined in accordance with the propeller patterns and/or a registration of the partial MRI images 301-306.

For instance, respective rotation and/or skewing parameters could be derived from an image-domain registration of the partial MRI images with respect to each other. It would also be possible that respective rotation and/or skewing parameters are derived from knowledge regarding the arrangement of the MRI measurement blades with respect to each other. For instance, the rotation angle of the rotation operation can correspond to the blade rotation angle between adjacent MRI measurement blades according to the propeller pattern.

In yet another scenario, it would be possible that the combination is implemented using an ML algorithm, e.g. a neural network algorithm. The combination can, accordingly, include inputting the multiple partial MRI images and/or k-space representation thereof into a neural network algorithm. The neural network algorithm can be trained using ground truth data that is obtained by, e.g., a Fourier-domain-based combination and/or an image-domain-based combination as explained above.

Summarizing, techniques have been disclosed where it is possible to reconstruct partial MRI images for each MRI measurement blade of a propeller pattern separately, including coil combinations across multiple receive channels. A Cartesian reconstruction technique can be used using implicit channel combinations. According to examples, an ML reconstruction algorithm can be used, e.g., a variational network. CSMs can be estimated for each MRI measurement blade separately. By such techniques, the individually-reconstructed partial MRI images have been found to better match with one other, providing advanced motion compensation. Further, separate reconstruction of the individual MRI measurement blades can facilitate the implementation of nonlinear reconstruction algorithms.

Although the disclosure has been shown and described with respect to certain preferred embodiments, equivalents and modifications will occur to others skilled in the art based upon the reading and understanding of the specification. The present disclosure includes all such equivalents and modifications.

The various components described herein may be referred to as "units" or "systems". Such components may be implemented via any suitable combination of hardware and/or software components as applicable and/or known to achieve the intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer readable medium. Regardless of the particular implementation, such units and systems, as applicable and relevant, may alternatively be referred to herein as "circuitry," "processors," or "processing circuitry," or alternatively as noted herein.

What is claimed is:

1. A computer-implemented method for generating a magnetic resonance imaging (MRI) image via an MRI device, comprising:
   obtaining multiple MRI measurement datasets, each one of the multiple MRI measurement datasets being acquired using a respective undersampling trajectory in k-space from among a set of undersampling trajectories forming a propeller pattern in k-space;
   reconstructing, for each MRI measurement dataset of the multiple MRI measurement datasets, a respective partial MRI image using a reconstruction algorithm based on the respective MRI measurement dataset; and
   generating the MRI image based upon combining each respective one of the partial MRI images.

2. A non-transitory computer-readable medium having instructions stored thereon that, when executed by one or more processors, causes the one or more processors to generate a magnetic resonance imaging (MRI) image by:
   obtaining multiple MRI measurement datasets, each one of the multiple MRI measurement datasets being acquired using a respective undersampling trajectory in k-space from among a set of undersampling trajectories forming a propeller pattern in k-space;
   reconstructing, for each MRI measurement dataset of the multiple MRI measurement datasets, a respective partial MRI image using a reconstruction algorithm based on the respective MRI measurement dataset; and
   generating the MRI image based upon combining each respective one of the partial MRI images.

3. The computer-implemented method of claim 1, wherein the combining of each respective one of the partial MRI images is performed in k-space.

4. The computer-implemented method of claim 1, wherein the reconstructing, for each MRI measurement dataset of the multiple MRI measurement datasets, the respective partial MRI image comprises reconstructing each respective partial MRI image as a coil-combined image, the combination of the partial MRI images being performed in k-space based upon (i) a sampling density of k-space defined by the propeller pattern, and (ii) a relative orientation of the partial MRI images.

5. The computer-implemented method of claim 1, wherein the combining of each respective one of the partial MRI images is executed in an image domain using rotation and skewing operations defined in accordance with one of the propeller pattern or a registration of the partial MRI images.

6. The computer-implemented method of claim 1, wherein the combining of each respective one of the partial MRI images comprises inputting one of the respective partial MRI images or respective k-space representations associated with the partial MRI images into a neural network algorithm.

7. The computer-implemented method of claim 1, further comprising:
   inputting the partial MRI images into a neural network algorithm to thereby reduce streaking artifacts in the generated MRI image.

8. The computer-implemented method of claim 1, further comprising:
   inputting the partial MRI images into a neural network algorithm to thereby compensate for local misalignments of the partial MRI images in the MRI image.

9. The computer-implemented method of claim 1, wherein each one of the set of undersampling trajectories samples k-space using an asymmetric partial sampling with respect to a center of k-space, the method further comprising:

for each one of the partial MRI images, filling k-space positions for which k-space data is missing due to the asymmetric partial sampling by copying k-space data from a conjugate symmetric location in k-space.

10. The computer-implemented method of claim 1, wherein:

the reconstruction algorithm is based on an optimization, a target function of the optimization is based upon a regularization operation, and the regularization operation is implemented using a variational neural network algorithm.

11. The computer-implemented method of claim 1, wherein the reconstructions algorithm is based on an iterative optimization using a compressed sensing scheme.

12. The computer-implemented method of claim 1, wherein the reconstruction algorithm estimates, for each one of the partial MRI images, respective coil sensitivity maps based on joint coil sensitivity maps.

13. The computer-implemented method of claim 1, wherein each MRI measurement dataset comprises at least 20 k-space lines.

14. The computer-implemented method of claim 1, wherein each respective MRI measurement dataset used to reconstruct a respective partial MRI image has a different k-space trajectory.

15. The computer-implemented method of claim 1, wherein the reconstructing comprises using a different calibrated coil sensitivity map (CSM) to reconstruct, for each MRI measurement dataset of the multiple MRI measurement datasets, the respective partial MRI image.

16. The computer-implemented method of claim 3, wherein the combining of each respective one of the partial MRI images comprises re-gridding k-space representations of the respective partial MRI images to a predefined target k-space sampling pattern to thereby obtain a joint k-space representation of the MRI image.

17. The computer-implemented method of claim 14, wherein the set of undersampling trajectories in k-space are rotated with respect to one another by a blade rotation angle to form the propeller pattern.

18. The computer-implemented method of claim 15, wherein the different CSM used to reconstruct each respective partial MRI image comprises a CSM of multiple receiver coils of the MRI device.

19. The computer-implemented method of claim 15, wherein the different CSM used to reconstruct each respective partial MRI image is computed by interpolating, from a common CSM, each respective undersampling trajectory in k-space.

20. The computer-implemented method of claim 16, wherein the combining of each respective one of the partial MRI images comprises normalizing the joint k-space representation of the MRI image in accordance with a sampling density of the k-space defined by the propeller pattern.

* * * * *